United States Patent [19]

Nakagawa et al.

[11] 4,404,076
[45] Sep. 13, 1983

[54] FILM FORMING PROCESS UTILIZING DISCHARGE

[75] Inventors: Katsumi Nakagawa, Tokyo; Tadaji Fukada, Kawasaki, both of Japan

[73] Assignee: Canon Kabushiki Kaisha, Tokyo, Japan

[21] Appl. No.: 412,076

[22] Filed: Aug. 27, 1982

Related U.S. Application Data

[63] Continuation of Ser. No. 105,778, Dec. 20, 1979, abandoned.

[30] Foreign Application Priority Data

Dec. 28, 1978 [JP] Japan .................................. 53-165848

[51] Int. Cl.³ ..................... C23C 13/08; C23C 11/00; H01L 31/15
[52] U.S. Cl. .................................. 204/164; 136/261; 427/39; 427/86; 422/186.04
[58] Field of Search ..................... 427/39, 86; 204/164, 204/177

[56] References Cited

U.S. PATENT DOCUMENTS

| | | | |
|---|---|---|---|
| 3,068,510 | 12/1962 | Coleman | 204/168 |
| 3,179,618 | 12/1979 | Tanaka et al. | 250/531 |
| 3,471,316 | 10/1969 | Manuel | 204/165 X |
| 3,473,459 | 10/1969 | Ehinger et al. | 204/164 X |
| 3,475,307 | 10/1969 | Knox et al. | 204/168 |
| 3,600,122 | 8/1971 | Coleman | 204/165 X |
| 3,730,863 | 5/1973 | Keller | 204/164 |
| 4,064,521 | 12/1977 | Carlson | 352/2 |
| 4,282,265 | 8/1981 | Priestly et al. | 427/39 |
| 4,317,844 | 3/1982 | Carlson | 427/39 |

OTHER PUBLICATIONS

Robertson, J. Electrochem. Soc., vol. 122, No. 6, pp. 796–800, Jun. 1975.

*Primary Examiner*—F. Edmundson
*Attorney, Agent, or Firm*—Fitzpatrick, Cella, Harper & Scinto

[57] ABSTRACT

A film forming process comprising introducing gas for forming a film from an inlet part for gas into a pressure-reducible deposition chamber wherein a substrate for forming a film thereon is supported by a fixing member, at least one of said substrate and fixing member are used so as to act as a first electrode, at least one portion of the wall of said deposition chamber is employed so as to act as a second electrode, the surface of said second electrode is arranged substantially in parallel to the surface for forming a film thereon, of said substrate, and said inlet part for gas and an outlet part for gas are arranged substantially in the positional relationship of rotation symmetry; and generating a glow discharge in said deposition chamber, thereby forming a film on said substrate.

6 Claims, 2 Drawing Figures

FILM FORMING PROCESS UTILIZING DISCHARGE

This is a continuation of application Ser. No. 105,778, filed Dec. 20, 1979, now abandoned.

BACKGROUND OF THE INVENTION

1. Field of the Invention

The present invention is concerned with a film forming process, and more particularly it relates to a process for forming films such as for example a photoconductive film, semiconductor film, inorganic insulating film and organic resin film, by means of a glow discharge.

2. Description of the Prior Art

When a film having desired properties is formed on a substrate in such a manner that source gas for forming a film is decomposed by utilizing the plasma phenomenon, and particularly in case of forming such a film of a large surface area, it is very difficult to obtain a film provided with a uniform thickness as well as equal physical properties such as electric, optical and photoelectric properties at the every portion extending over the entire surface area of the film, as compared with the conventional vacuum deposition. For example, formation of a film of amorphous hydrogenated silicon (hereinafter represented by "a-Si:H") is considered. When an a-Si:H film is formed on a substrate by utilizing discharge energy to decompose $SiH_4$ gas and the electric physical property of the film is utilized, it is necessary to achieve equal or uniform intensity of the discharge in the entire area for the film formation for the purpose of obtaining equality or uniformity of electric physical property at the every portion covering the entire area of the film since the electric physical property depends greatly upon the intensity of the discharge emloyed during the film formation. However, it is very difficult to achieve uniform intensity of the discharge in the conventional process, particularly when a film of a larger surface area is formed.

Further, in general, the glow discharge deposition utilizing the plasma phenomenon is slow in the speed for forming a film as compared with usual vacuum vapor deposition. Due to this, in connection with the glow dischrge deposition, it is proposed to increase the flow amount of gas to be introduced into a deposition chamber. However, in the conventional process, it is difficult to attain equal flow amount of gas in the whole area for the film formation. Therefore, when the flow amount of gas is increased to attain high speed for forming a film, the flow amount of gas becomes unequal depending upon the spot and ultimately it is considerably difficult to obtain uniform thickness as well as equal properties in the entire area of a film.

Moreover, the uniformity or equality of the thickness and properties of a film to be formed depends greatly upon the positional relation between electrodes and a substrate for forming a film as well as the structure of the electrode. The conventional process is not necessarily satisfactory in this respect and therefore is unsuitable for repeating the film formation of a larger surface area and mass-producing a film having equal properties at every portion.

In view of the foregoing, the conventional process involves drawbacks as mentioned above, and particularly in the conventional process problems concerning the reproducibility and mass-producibility of a film is indicated informing a film having a larger surface area provided with uniform properties and thickness.

SUMMARY OF THE INVENTION

It is therefore the primary object of the present invention to provide an improved film forming process using a glow discharge.

It is another object of the present invention to provide a film forming process using a glow discharge which is able to form, with good reproducibility, a film having a substantial uniformity or equality in the physical properties and thickness at every portion of the entire surface area even when the film is of a large surface area.

It is a further object of the present invention to provide a film forming process which is particularly effective to the mass-production.

According to the present invention, there is provided a film forming process comprising introducing gas for forming a film from an inlet part for gas into a pressure-reducible deposition chamber wherein a substrate for forming a film thereon is supported by a fixing member, at least one of said substrate and fixing member are used so as to act as a first electrode, at least one portion of the wall of said deposition chamber is employed so as to act as a second electrode, the surface of said second electrode is arranged substantially in parallel to the surface for forming a film thereon, of said substrate, and said inlet part for gas and an outlet part for gas are arranged substantially in the positional relationship of rotation symmetry; and generating a glow discharge in said deposition chamber, thereby forming a film on said substrate.

DETAILED DESCRIPTION OF THE PREFERRED EMBODIMENT

In the film forming process of the present invention, a substrate for forming a film thereon or a fixing member for supporting the substrate or both of them are used so as to act as one of a pair of electrodes, i.e. a first electrode while at least one portion of the wall of a deposition chamber is employed so as to function as the other electrode, i.e. a second electrode, and the second electrode and the substrate are arranged so that the surface of the former and that of the latter for forming a film may be made substantially parallel to each other. By such constitution, the uniform intensity of discharge can be achieved over a large surface area, and the structure of the deposition chamber and arrangement of the components constituting the chamber can be simplified so that the adverse influence of the structure of the chamber and arrangement of its components on the properties of a film to be formed can be minimized as far as possible as compared with the conventional process.

Further, in the present invention, an inlet part for gas and outlet part for gas are arranged so that the positional relationship of a substantial rotation symmetry may be established therebetween, and source gas for forming a film is introduced through the gas inlet part into the deposition chamber to produce a glow discharge in the deposition chamber. As a result, even when the flow amount of gas in the deposition chamber is increased to a great extent, possible lack of uniformity concerning the discharge intensity in different spots can be effectively avoided.

Therefore, according to the film forming process of the present invention, films having a uniform thickness can be mass-produced with equal properties, and the yield of the mass-production is extremely improved in comparison to the prior art process. Further, the flow amount of gas can be remarkable increased, for example to 20–300 ml/min, as compared with the conventional process. As a result, the film forming speed can be far accelerated thereby shortening the period of time for forming a film so that the productivity of a film can be extremely increased and besides the total cost can be reduced to a great extent.

Figure 1:
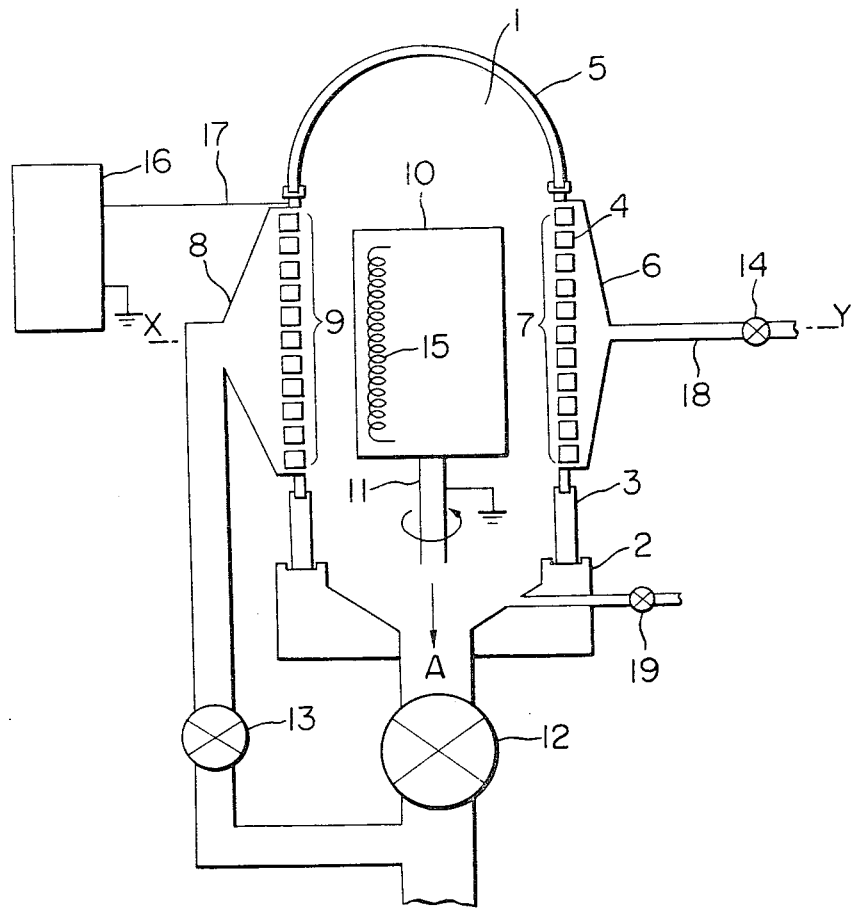
FIG. 1 is a schematic explanatory view showing an apparatus embodying the process of the present invention.

With reference to the attached drawings, the present invention will be explained in detail. FIG. 1 schematically shows a preferred example of a device which is able to embody a film forming process utilizing a glow discharge according to the present invention. A deposition chamber 1 in which pressure can be reduced, includes a base plate 2 of such a structure as employed in a usual glow discharge-depositing apparatus, an electrically insulating ring 3 arranged on the plate 2, a cylindrical metallic electrode 4 provided on the insulating ring 3, and an electrically insulating cover 5 positioned on the electrode 4. These members constituting the deposition chamber 1 are arranged through O-rings. The insulating ring 3 and insulating cover 5 may be preferably made of quartz glass. The metallic electrode 4 is provided with an inlet part 6 for gas stream for the purpose of introducing source gas for forming a film, if necessary in the form mixed with a diluting gas as well as an outlet part 8 for gas stream in order to exhaust gas from the inside of the deposition chamber 1. The inlet part 6 includes at least one inlet 7 having a predetermined conductance. The outlet part 8 contains at least one outlet 9 having a predetermined conductance. The inlet part 6 and outlet part 8 are arranged in a positional relationship of a substantial rotation symmetry with the central axis of the metallic electrode 4 as the rotation axis.

A substrate 10 for forming a film is supported by a fixing member 11 disposed at a predetermined position in the deposition chamber 1. The fixing member 11 is designed so as to be rotated with its central axis as the center of the rotation for the purpose of forming a film having uniform properties on the entire area of the substrate surface 10 for forming a film. Further, the fixing member 11 is electrically grounded so as to act as a counter electrode for example when the substrate 10 is not electrically conductive. When the substrate 10 is for example a metallic drum for electrophotographic photosensitive member, it is utilized as the counter electrode. In the latter case, the substrate 10 is electrically connected with the fixing member 11, which is then electrically grounded. Alternatively, the substrate 10 may be directly grounded without the connection with the fixing member 11.

In the present invention, from a point of the designing view that uniform flow amount of gas can be more effectively achieved at the every spot in the deposition chamber 1, the substrate 10 is preferably made in the cylindrical form. As a result, the object of the present invention can be effectively attained.

A main valve 12 is opened and closed to evacuate the air in the deposition chamber 1 when formation of a film starts. Numeral 13 denotes an auxiliary valves which is used to exhaust the gas in the deposition chamber 1 to the outside through the outlet part 8 during the film formation. Numeral 14 indicates a valve which is opened and closed at the time of introducing the predetermined gas into the deposition chamber 1 from a bomb (not shown) and also has a function of adjusting and controlling the flow amount of the gas to be introduced.

During the film formation, the main valve 12 is closed while the auxiliary valve 13 and valve 14 are regulated to introduce gas in the desired flow amount and flow speed for the purpose of attaining the uniform flow amount and flow speed of the gas in the deposition chamber 1.

Numeral 15 denotes a heater which is used to keep the substrate 10 at a fixed temperature during the film formation or before and after the film formation.

The metallic electrde 4 is connected with a power source 16 of high frequency for generating a glow discharge in the deposition chamber 1. The other terminate of the power source 16 is grounded as illustrated in FIG. 1. Alternatively, it is connected with the substrate 10 and/or the fixing member 11 which are used as the counter electrode.

In the present invention, a uniform film is formed over the entire surface area for forming a film in accordance with the characteristics of the invention even when the substrate 10 is not rotated. However, for the purpose of obtaining further uniformity or equality of the film properties, it is desired that the substrate 10 is given a slow rotation motion at a uniform velocity or uniform accelerated velocity during the film formation. In this case, the rotation speed of the substrate is determined arbitrary depending upon the mutual relation with the speed of forming a film. For example, as for a cylindrical substrate, good results are obtained when it is given a rotation motion at an equal velocity of about 5 revolutions per minute. By rotating the substrate 10 with the fixing member 11 as the center of the rotation, the equality for the intensity of discharge can be attained, and as a result, a film with equal properties and uniform thickness can be obtained on the substrate 10 as compared with the case in which the substrate 10 is not rotated.

In the present invention, the inlet part and outlet part are arranged substantially in the positional relationship of the rotation symmetry as mentioned in the foregoing. Particularly, those parts are preferably disposed so that in the cross-section of the film forming substrate and deposition chamber, the outlet part may be positioned on the opposite side of the inlet part with respect to a line which intersects perpendicularly to a line connecting the rotation axis of the rotation symmetry to the position of the inlet part and meets at right angles with the rotation axis.

Figure 2:
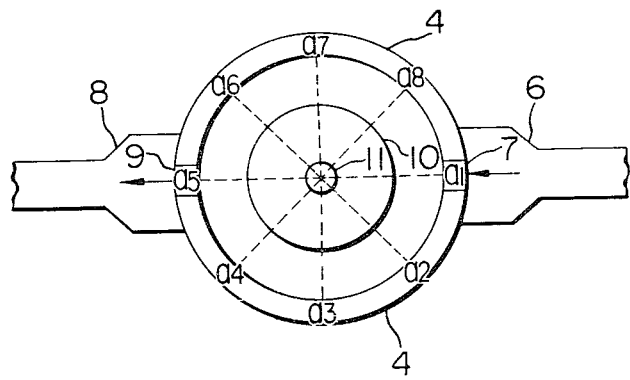
FIG. 2 is a schematic sectional view taken on the line X-Y of FIG. 1.

The positional relationship between the inlet part 6 and outlet part 8 is shown in FIG. 2 which is a schematic cross-sectional view taken along the line X–Y of FIG. 1. In FIG. 2, there is illustrated an example in which a single inlet part 6 and one outlet part 8 are arranged in the positional relationship of the rotation symmetry with $\pi$ rotation. However, the present invention is not restricted to this arrangement, and a plurality of the inlet parts and outlet parts may be used as far as they statisfy the positional relationship of the rotation symmetry. The inlet parts and outlet parts are arranged, for example in the following relationship. For example, when a single inlet part is located at position "$a_1$", one outlet part is provided at position "$a_5$", or a plurality of the outlet parts are arranged at positions "$a_4$" and "$a_6$" or at positions "$a_4$", "$a_5$" and "$a_6$". When the inlet parts are located at positions "$a_1$", "$a_2$" and "$a_8$", the outlet part is provided at position "$a_5$", or a plurality of the outlet parts are arranged at positions "$a_4$", "$a_5$" and "$a_6$" or at positions "$a_4$" and "$a_6$". In such a case, the conductance of each inlet part and outlet part is designed or controlled so that the flow amount and flow rate of gas may be made uniform in the deposition chamber 1.

When a desired film is formed on a substrate by using such an apparatus as illustrated in FIG. 1, a cylindrical substrate 10, which is cleaned if necessary, is firmly fixed to the fixing member 11, and the electrically insulating ring 3, metallic electrode 4 in the form of a cylinder and electrically insulating cover 5 are arranged in the named order on the base plate 2, and further the air in the deposition chamber 1 is evacuated from the bottom by opening the main valve 12 to bring the deposition chamber 1 to a predetermined vacuum degree. The metallic electrode 4 is connected with the power source 16 of high frequency by way of a coaxial cable 17.

At the time when the deposition chamber 1 reaches a predetermined vacuum degree, the main valve 12 is closed, while the auxiliary valve 13 is opened and the valve 14 is further opened to introduce gas for forming a film, for example silane gas such as $SiH_4$ and the like in case of forming a film of a-Si:H, in a fixed flow amount by way of the pipe 18 from the inlet part 6 into the deposition chamber 1. Then, the auxiliary valve 13 is regulated to bring the deposition chamber 1 into a predetermined inside pressure. When the inside of the deposition chamber 1 is filled with the gas for forming a film to a fixed pressure, a glow discharge is produced between the electrode 4 and substrate 10 to bring the gas in the deposition chamber 1 into the form of gas plasma, thereby carrying out the formation of a film on the substrate 10.

In the case as mentioned above, when the substrate 10 is rotated, the intensity of the discharge can be made average irrespective of the shape of the electrode 4 even if the flow amount of the gas is not uniform, and as a result, a good film is obtained which has equal physical properties and uniform thickness at every portion covering a large surface area. Further, the flow rate of gas is determined taking the decomposition rate of the gas into account, and when the decomposition rate is high the flow rate is preferably made high. Besides, the vacuum state in the deposition chamber 1 is broken by opening a leak valve 19.

In the apparatus shown in FIG. 1, the fixing member 11 is made into the form of a rod since that form is suitable for supporting the substrate 10 in the form of a cylinder. Needless to say, it is necessary to modify the form of the fixing member as well as the arrangement thereof so that the substrate may be conveniently supported by the fixing member in accordance with the form of the substrate.

What we claim:

1. A film forming process utilizing glow discharge which comprises positioning a drum shaped substrate for forming a film on a fixing member in a pressure-reducible deposition chamber so that a film-forming surface of the substrate is substantially parallel to a discharge surface of an electrode which is spaced around the substrate; reducing the pressure in the deposition chamber to a predetermined pressure; introducing a gas containing a source of silicon for forming an amorphous silicon film into said deposition chamber from a gas inlet, directing said stream substantially perpendicular to the central axis of said substrate; generating a glow discharge between said electrode and said substrate to decompose said gas and to form at least a substantially uniform film of the resulting amorphous silicon on the film forming surface of the substrate and exhausting unused gas from said deposition chamber through a gas outlet opposed to said gas inlet.

2. The film forming process according to claim 1 including the step of slowly rotating said substrate during the formation of the film to insure a film of uniform thickness.

3. The film forming process according to claim 1 in which said gas contains both a source of silicon and a source of hydrogen for forming an amorphous hydrogenated film.

4. The film forming process according to claim 3 in which the gas is silane gas.

5. A film forming process utilizing glow discharge which comprises positioning a drum shaped substrate for forming a film on a fixing member in a pressure-reducible deposition chamber so that a film-forming surface of the surface is substantially parallel to a discharge surface of an electrode which is spaced around the substrate; reducing the pressure in the deposition chamber to a predetermined pressure; introducing a gas containing a source of silicon for forming an amorphous silicon film into said deposition chamber from a plurality of gas inlets; directing said gas stream substantially perpendicular to the central axis of said substrate; exhausting unused gas from said deposition chamber through a plurality of gas outlets, each said gas outlets diametrically opposed to a corresponding gas inlet; and generating a glow discharge between said electrode and said substrate to decompose said gas and to form at least a substantially uniform film of the resulting amorphous silicon on the film forming surface of the substrate.

6. The film forming process according to claim 1 in which the flow rate of the gas in the deposition chamber is 20–300 ml/min.

* * * * *

UNITED STATES PATENT AND TRADEMARK OFFICE
CERTIFICATE OF CORRECTION

PATENT NO. : 4,404,076

DATED : September 13, 1983

INVENTOR(S) : NAKAGAWA, ET AL.

It is certified that error appears in the above-identified patent and that said Letters Patent is hereby corrected as shown below:

Title Page, [75] Inventors:, "Fukada" should be --Fukuda--.
Col. 1, line 23, delete "the".
Col. 1, line 34, "the every" should be --every--.
Col. 1, line 36, "emloyed" should be --employed--.
Col. 1, line 42, "speed" should be --time--.
Col. 1, line 45, "dischrge" to --discharge--.
Col. 2, line 1, "informing" should be --in forming--.
Col. 2, line 11, delete "the".
Col. 2, line 17, "to the" should be --for--.
Col. 3, line 10, "remarkable" should be --remarkably--.
Col. 3, line 15, "extremely" should be --greatly--.
Col. 3, line 15, delete "besides".
Col. 3, line 61, after "a" insert --design--.
Col. 3, line 61, delete "the designing".
Col. 3, line 62, after "view" insert --in order--.
Col. 3, line 63, "the every" should be --each--.
Col. 4, line 1, "valves" should be --valve--.
Col. 4, line 19, "electrde" should be --electrode--.
Col. 4, line 21, "terminate" should be --terminal--.
Col. 4, line 35, "arbitrary" should be --arbitrarily--.
Col. 4, line 53, delete "to".

Signed and Sealed this

Sixth Day of March 1984

[SEAL]

Attest:

GERALD J. MOSSINGHOFF

Attesting Officer

Commissioner of Patents and Trademarks